United States Patent [19]
Yamaguchi et al.

[11] Patent Number: 4,885,708
[45] Date of Patent: Dec. 5, 1989

[54] APPARATUS AND METHOD FOR MEASURING FREQUENCY RESPONSE FUNCTION

[75] Inventors: Takahiro Yamaguchi, Kumagaya; Toshiharu Kasahara, Okegawa; Hiromi Kosawa, Gyoda, all of Japan

[73] Assignee: Advantest Corporation, Tokyo, Japan

[21] Appl. No.: 271,879

[22] Filed: Nov. 16, 1988

[30] Foreign Application Priority Data

Nov. 20, 1987 [JP] Japan .................. 62-294318

[51] Int. Cl.⁴ .............................. G06F 15/31
[52] U.S. Cl. ................................. 364/553
[58] Field of Search ............... 364/553; 73/579, 582, 73/583; 324/77 R, 77 B

[56] References Cited

U.S. PATENT DOCUMENTS

| | | | |
|---|---|---|---|
| 3,973,112 | 8/1976 | Sloane | 364/553 |
| 4,061,017 | 12/1977 | Sloane et al. | 73/579 |
| 4,067,060 | 1/1978 | Poussart et al. | 364/553 |
| 4,539,518 | 9/1985 | Kitayoshi | 324/77 B |
| 4,654,809 | 3/1987 | Adcock | 364/553 |
| 4,658,367 | 4/1987 | Potter | 364/553 |

FOREIGN PATENT DOCUMENTS 59-56170  3/1984  Japan ............................ 364/553

Primary Examiner—Michael J. Tokar
Assistant Examiner—Louis M. Arana
Attorney, Agent, or Firm—Staas & Halsey

[57] ABSTRACT

A plurality of relatively prime excitation waveforms are generated and applied to an object to be measured. Data of the excitation waveforms and a response waveform from the object are extracted by one frame every n frames and subjected to Fourier transform, thereby computing an input auto spectral matrix and an input-output cross spectral matrix. A frequency response function of the object is calculated from averaged spectral matrices obtained by adding and averaging corresponding elements of the corresponding spectral matrices a predetermined number of times. Readout start addresses for multiple waveforms, each stored in one of a plurality of waveform memories and having continuity at both ends, are shifted relative to each other every n frames, thereby obtaining the plurality of relatively prime excitation waveforms.

5 Claims, 2 Drawing Sheets

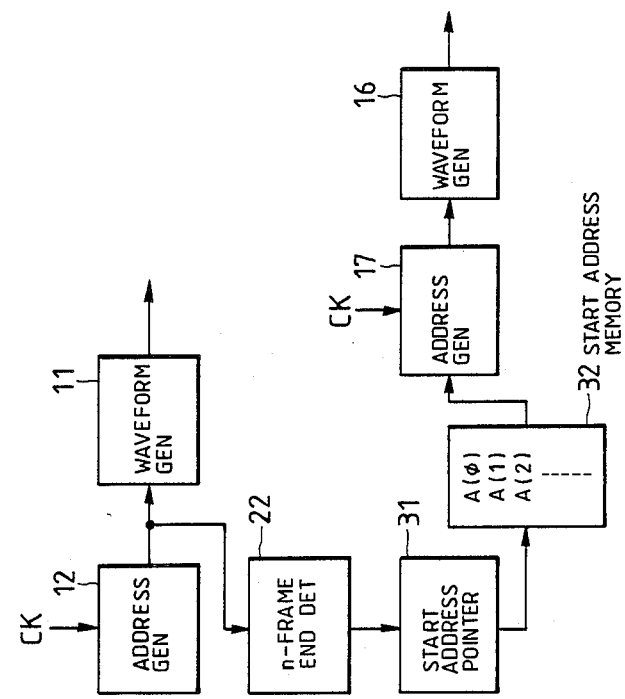

APPARATUS AND METHOD FOR MEASURING FREQUENCY RESPONSE FUNCTION

BACKGROUND OF THE INVENTION

The present invention relates to a frequency response function measuring method for obtaining a frequency response function matrix of a multi-input/multi-output object by applying thereto waveforms from a plurality of waveform generators and multiplying its input-output cross spectral matrix by an inverse matrix of its input auto spectral matrix.

Multi-point excitation is needed for measuring the frequency response function of a structure which cannot be sufficiently excited by one-point excitation, that is, an excitation applied as a vibrating force to a single point on an object. With one-point excitation, a modal parameter of the characteristic frequency varies with the point of excitation. With multi-point excitation, however, the modal parameter is less dispersive because the entire structure can be excited with a constant exciting force, and measured frequency response functions are less inconsistent among them because a plurality of frequency response functions are measured at the same time.

An output spectrum $S_y(i)$ at a point i is expressed by a linear combination of a conditional frequency response function $L(i, j)$ between each excitation point j and the output point i with an input spectrum $S_x(j)$ at the excitation point j, as follows:

$$S_y(i) = L(i, 1)S_x(1) + L(i, 2)S_x(2) + \quad (1)$$

Accordingly, a multi-input model is essentially a matrix and a frequency response function matrix (L) is a transformation of an input-output cross spectral matrix $[G_{yx}]$ from an input auto spectral matrix $[G_{xx}]$; namely, $$[G_{yx}] = [L][G_{xx}] \quad (2)$$

A conditional frequency response function matrix to be obtained is given as follows:

$$L] = [G_{yx}][G_{xx}]^{-1} \quad (3)$$

This equation holds irrespective of whether exciting forces are correlated to one another or not.

The prior art employs, for the multi-point excitation, signals which are not correlated in their exciting force. In the case of using pure random signals for excitation, however, since a Fourier transformation is performed after multiplying the response waveform by a window function, a leakage error occurs. This results in the gain being measured rather small for a resonant structure with a sharp frequency response function; therefore, the attenuation factor is overestimated.

There has been proposed a burst random excitation method in which pure random waves are generated repeatedly in a burst-like manner for a period of time $\frac{1}{2}$ to $\frac{2}{3}$ of an analysis frame. With this method, in the case of a response with a small attenuation factor, it is necessary to multiply the response waveform by an attenuation term so that an attenuation occurs in the analysis frame. However, this may sometimes affect the frequency resolution, the gain and an estimate of the phase of the conditional frequency response function. Conversely, in the case of a response with a large attenuation factor, a free response after the duration of the burst wave is observed in the analysis frame. This causes correlation among output signals or conditional output signals and decreases independent information of the input-output cross spectral matrix $[G_{yx}]$ of Eq. (2), introducing the possibility of making it impossible to measure the conditional frequency response function.

SUMMARY OF THE INVENTION

It is therefore an object of the present invention to provide a frequency response function measuring method and apparatus which are excellent in accuracy of measurement, dynamic range and frequency resolution, regardless of the excitation signal waveform used.

According to the present invention, a multiple waveform, that is, a superposed waveform which contains analyzing frequency components, is prestored in each of a plurality of waveform generators. Each multiple waveform has both ends continuous to each other. The multiple waveforms are read out of these waveform generators and supplied to different points of an object to be measured. Address generating means for generating the waveforms from the waveform generators, are driven so that their waveform readout start addresses are shifted relative to each other every n frames (where n is an integer equal to or greater than 1, and each frame is a group of successively generated samples in a predetermined analysis length). Respective elements of input-output cross spectral matrices and input auto spectral matrices obtained before and after the shifting of the readout start addresses are respectively averaged and the averaged elements are used to obtain a frequency response function matrix.

It does not matter whether the generated waveforms are correlated to one another for the n frames. When it is determined as a result of the averaging, that there is full coherence, i.e. a causal relationship between the input signals (the generated waveforms), measurement is impossible. However, when the coherence function between the input signals is incomplete, that is, when the coherence function is not 1.0, the measurement is significant. In other words, if the coherence function is smaller than 1.0, the measured results are significant.

The waveform generation is performed by reading out the waveforms from the one waveform generator in synchronism with a fixed clock and the waveforms from the other waveform generator is synchronism with a fixed clock. After completion of the generation of the n frames, the waveform generation is skipped by a programmed number of data, that is, a random time lag is provided equivalently, and then the next n frames are generated. This time lag is selected without any correlation with the sampling frame. In other words, relatively prime sequences can be produced by controlling the readout timing of the waveform generators or their readout addresses. The waveforms to be produced can be selected freely (which is impossible with the prior art). Even if identical signals are concurrently generated from a plurality of waveform generators, the conditional frequency response function can be measured by making provision so that they become relatively prime (that is, the coherence function is smaller than 1). Furthermore, the waveforms which contain analyzing frequency points over the entire measuring frequency band need not necessarily be prestored in the waveform generators, but it is also possible to write in different areas a plurality of narrow-band waveforms into which the measuring frequency band is split, and measure the frequency response function by a relatively prime waveform sequence for each narrow band.

BRIEF DESCRIPTION OF THE DRAWINGS

FIG. 2 is a block diagram of a partly modified form of the embodiment depicted in FIG. 1; and FIG. 3 is a block diagram of another partly modified form of the embodiment depicted in FIG. 1.

DESCRIPTION OF THE PREFERRED EMBODIMENTS

Figure 1:
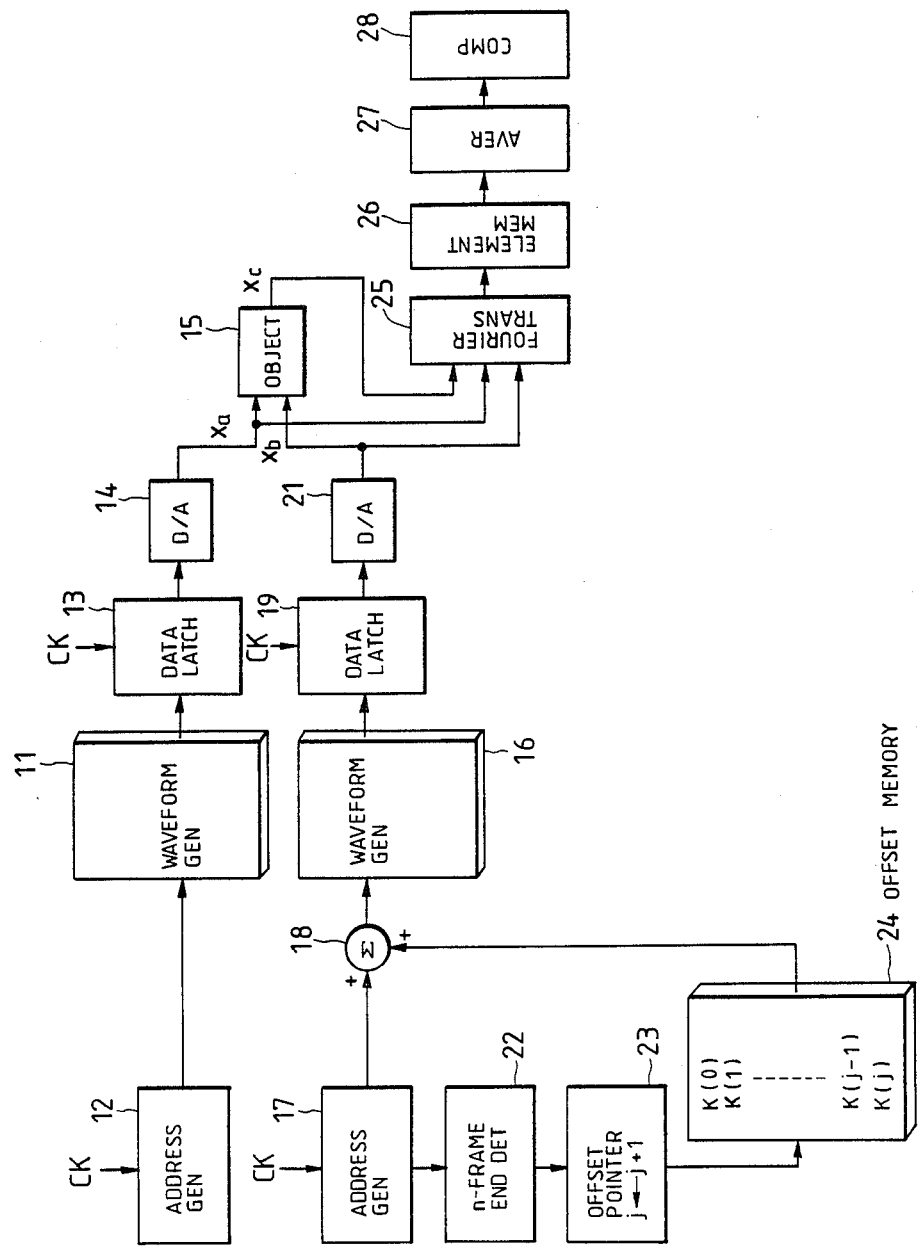
FIG. 1 is a block diagram of an embodiment of the frequency response function measuring apparatus of the present invention.

FIG. 1 illustrates an embodiment of the present invention. A waveform generator 11 is a ROM or RAM, in which a waveform is stored and from which a waveform is read out by addresses from an address generator 12. The address of the address generator 12 is updated by a fixed clock. The data read out of the waveform generator 11 is latched in a data latch 13 by a clock, and the output from the data latch 13 is converted by a D/A converter 14 into an analog signal, which is provided to an object to be measured 15.

A waveform generator 16 is also a ROM or RAM, which has stored therein a waveform cut out of a continuous waveform. This waveform may be identical with or different from the stored waveform of the waveform generator 11 but is a waveform cut out so that both ends of the waveform are continuous to each other. It is possible, in practice, to employ multiple sine waves which are obtained by superposing a number of sine waves spaced a fixed frequency apart in the analyzing frequency range. An address generator 17 generates an address which is updated by a fixed clock, and the address is applied as a readout address to the waveform generator 16 via an adder 18. The data read out of the waveform generator 16 is latched in a data latch 19 for each clock, and the output from the data latch 19 is converted by a D/A converter 21 into an analog signal, which is provided to the object 15.

When the address generation from the address generator 17 has been performed for n frames, this is detected by an n-frame end detector 22 and, upon each detection, an offset pointer 23 is incremented by one. An offset memory 24 is read out in accordance with a value K indicated by the offset pointer 23, and the amount of offset is provided to the adder 18. Accordingly, the address which is applied to the waveform generator 16 is shifted by the amount of offset from the offset memory 24 every n frames. In this way, relatively prime waveform sequences are provided every n frames from the D/A converters 14 and 21.

Input waveforms $x_a$ and $x_b$ to the object 15 and an output waveform $x_c$ therefrom are converted by Fourier transform means 25 into signals in the frequency domain, that is, complex spectral signals $S_a$, $S_b$ and $S_c$, respectively. The conditional frequency response function matrix of Eq. (3) in the case of two-point excitation is expressed as follows:

$$\begin{pmatrix} L_{aa} & L_{ba} \\ L_{ab} & L_{bb} \\ L_{ac} & L_{bc} \end{pmatrix} = \begin{pmatrix} G_{aa} & G_{ba} \\ G_{ab} & G_{bb} \\ G_{ac} & G_{bc} \end{pmatrix} \cdot \begin{pmatrix} G_{aa} & G_{ba} \\ G_{ab} & G_{bb} \end{pmatrix}^{-1} \quad (4)$$

where an inverse matrix of the input auto spectral matrix is expressed as follows:

$$\begin{pmatrix} G_{aa} & G_{ba} \\ G_{ab} & G_{bb} \end{pmatrix}^{-1} = \frac{1}{\begin{vmatrix} G_{aa} & G_{ba} \\ G_{ab} & G_{bb} \end{vmatrix}} \cdot \begin{pmatrix} G_{bb} & -G_{ba} \\ -G_{ab} & G_{aa} \end{pmatrix} \quad (5)$$

The conditional frequency response functions which are desired to be measured in practice are a matrix element $L_{ac}$ which is a conditional frequency response function between an excitation point a and a receiving point b and a matrix element $L_{bc}$ which is a conditional frequency response function between an excitation point b and the receiving point c. These matrix elements are given by the following equations, respectively:

$$L_{ac} = \frac{G_{ac \cdot b}}{G_{aa \cdot b}} = \frac{G_{ac} - \frac{G_{bc}}{G_{bb}} \cdot G_{ab}}{G_{aa} - \frac{G_{ba}}{G_{bb}} \cdot G_{ab}} \quad (6)$$

$$L_{bc} = \frac{G_{bc \cdot a}}{G_{bb \cdot a}} = \frac{G_{bc} - \frac{G_{ac}}{G_{aa}} \cdot G_{ba}}{G_{bb} - \frac{G_{ab}}{G_{aa}} \cdot G_{ba}} \quad (7)$$

In the above, $G_{ac \cdot b}$ and $G_{aa \cdot b}$ indicate spectra obtained after eliminating the influence of excitation at the excitation point b from the input-output cross spectrum $G_{ac}$ and the input auto spectrum $G_{aa}$, respectively. Similarly, $G_{bc \cdot a}$ and $G_{bb \cdot a}$ indicate spectra obtained after eliminating the influence of excitation of the excitation point a from the input-output cross spectrum $G_{bc}$ and the input auto spectrum $G_{bb}$, respectively.

The coherence function between the excitation waveforms $x_a$ and $x_b$ applied to the two excitation points a and b is given by the following equation:

$$\gamma_{ab}^2 = \frac{|G_{ab}|^2}{G_{aa} \cdot G_{bb}} \quad (8)$$

Further, matrix elements in Eq. (4) are given by the following equation:

$$\begin{aligned} G_{aa} &= S_a S_a^* \\ G_{bb} &= S_b S_b^* \\ G_{ab} &= S_b S_a^* \\ G_{ba} &= S_a S_b^* \\ G_{ac} &= S_c S_a^* \\ G_{bc} &= S_c S_b^* \end{aligned} \quad (9)$$

In the above, $S_a^*$ and $S_b^*$ are conjugate complex numbers of $S_a$ and $S_b$.

The respective matrix elements calculated by Eq. (9) are stored in an element memory 26. These matrix elements are calculated, by Eq. (9), from complex spectrum data $S_a$, $S_b$ and $S_c$ obtained by fast Fourier transform of the input waveforms $x_a$ and $x_b$ and the output waveform $x_c$ of at least one frame each time the readout address for the waveform generator 16 is shifted (i.e. every n frames). The corresponding matrix elements of the matrix thus obtained every n frames are sequentially averaged by averaging means 27 a predetermined number of times. The thus averaged matrix elements are used to compute the frequency response functions $L_{ac}$ and $L_{bc}$ of Eqs. (6) and (7) by computing means 28.

In concrete terms, the waveform generator 11 successively outputs multiple sine waves in a free running state and the waveform generator 16 generates multiple sine waves while shifting the waveform readout address by the amount of offset K (where K is a random variable) every n frames.

As mentioned above, according to the present invention, the spectral matrix every n frames is averaged at least twice. In the coherence function shown in Eq. (8), the matrix elements $G_{aa}$ and $G_{bb}$ are always positive real numbers as will be evident from Eq. (9). However, since the matrix element $G_{ab}$ is a complex number and since the waveform readout addresses for the waveform generator 16 are sequentially shifted every n frames (i.e. delayed), the phase angle of the matrix element $G_{ab}$ on complex plane coordinates is shifted. As a result of this, both the real and the imaginary part of the complex number $G_{ab}$ can take any positive and negative values. By adding and averaging such complex numbers every n frames, the absolute values of the real and imaginary parts of the averaged value $\overline{G_{ab}}$ of the complex numbers $G_{ab}$ will both gradually decrease. Consequently, $|G_{ab}| > |\overline{G_{ab}}|$ always holds and this guarantees that the coherence function shown in Eq. (8) becomes smaller than 1, ensuring the existence of the inverse matrix of Eq. (5). For instance, when the addition and the averaging are not performed, the coherence function always becomes 1 and the inverse matrix of Eq. (5) is indefinite.

Calculating the coherence function, by Eq. (8), from respective elements of the averaged spectral matrix in the case of sequentially delaying by the amount of offset K the waveforms which are generated every n successive frames, the coherence function presents a so-called "comb-type" characteristic which has certain periodicity on the frequency axis. The period of the comb teeth is 1/(an integer) times the following frequency:

$$f_c = P/K$$

where P is an analyzing frame period. If $f_c$ agrees with the frequency resolution of the signal processor, then the frequency at which the coherence function takes a value close to 1.0 will occur in the lower frequency band, making it impossible to measure the frequency response function at this frequency. Accordingly, it is practical to select the amount of offset K incoherent to the sampling frame so as not to limit the measuring frequency range.

FIGS. 2 and 3 illustrate partly modified forms of the embodiment depicted in FIG. 1. In the modified form of FIG. 2 the address generator 17 is omitted and the address generator 12 is used for both of the waveform generators 11 and 16. In FIG. 3, when the address generation from the address generator 12 has been performed for n frames, it is detected by the n-frame end detector 22 and, upon each detection, a start address pointer 31 is incremented by one. On the basis of the indicated value of the start address pointer 31 a start address memory 32 is read out and a start address A(j) thus read out is set in the address generator 17. The address generated from the address generator 17 is provided directly to the waveform generator 16.

As described above, according to the present invention, the problems of restrictions regarding (1) the selection of a pattern and (2) the accuracy of measurement, the dynamic range and the frequency resolution in the conventional measuring method utilizing random patterns are radically removed by the method of generating relatively prime sequences. Accordingly, the present invention enlarges the range and field of application of the multi-point excitation.

It will be apparent that many modifications and variations may be effected without departing from the scope of the novel concepts of the present invention.

What is claimed is:

1. A frequency response function measuring apparatus for connection to an object to be measured, comprising:

first address generating means for repeatedly generating a sequence of addresses in synchronism with a clock;

second address generating means for generating a sequence of addresses in synchronism with the clock, while arbitrarily shifting the sequence of addresses every fixed period;

first waveform generating means which has written therein a first multiple waveform containing desired analyzing frequency components and having opposite ends which are continuous to each other, the first multiple waveform being read out by the addresses generated by said first address generating means to generate a first analog excitation signal to be applied to the object to be measured;

second waveform generating means which has written therein a second multiple waveform containing desired analyzing frequency components and having opposite ends which are continuous to each other, the second multiple waveform being read out by the addresses generated by said second address generating means to generate a second analog excitation signal to be applied to the object to be measured.

Fourier transform means for extracting at least one frame of a predetermined numer of samples from each of the first and second analog excitation signals and a response signal from the object in a predetermined length of analysis every said fixed period, and for subjecting each frame of the extracted samples of the first and second excitation signals and the response signal to Fourier transform and then to calculation of elements of a cross spectral matrix every said fixed period;

averaging means for sequentially averaging corresponding elements of the corresponding cross spectral matrices a predetermined number of times corresponding to the shifting of the sequence of addresses to obtain elements of an averaged cross spectral matrix; and computing means for computing a desired frequency response function from selected elements of the averaged cross spectral matrix calculated by said averaging means.

2. The frequency response function measuring apparatus of claim 1, wherein said second address generating means includes:

an address generator for repeatedly generating a sequence of addresses in synchronism with the clock; and offset address adding means for adding a different offset address to the sequence of addresses to generate an address for reading out the second multiple waveform upon each generation of addresses for n frames from said address generator, where n is an integer equal to or greater than 1.

3. The frequency response function measuring apparatus of claim 2, wherein said address generator also acts as said first address generating means.

4. The frequency response function measuring apparatus of claim 1, wherein said second address generating means includes:

start address generating means for generating a different start address upon each generation of addresses of n frames, where n is an integer equal to or greater than 1; and an address generator, coupled to said start address generating means, for responding to the start address from said start address generating means to start the sequence of addresses at the start address.

5. A frequency response function measuring method for obtaining a frequency response function matrix of a multi-input/multi-output object of applying thereto stored waveforms from a plurality of waveform generators, comprising the steps of:

driving the waveform generators so that the waveforms are read out while addresses for reading out the waveforms are shifted relative to each other every n frames, where n is an integer equal to or greater than 1, each frame being a group of generated samples of a predetermined analysis length;

applying the waveforms generated by the waveform generators to the object;

subjecting each of the waveforms and a response from the object to Fourier transformation to obtain spectral components thereof and computing elements of cross spectral matrix from the spectral components;

averaging respective elements of the cross spectral matrices obtained before and after the shifting of the readout start addresses; and obtaining the frequency response function matrix by using the averaged elements.

* * * * *

UNITED STATES PATENT AND TRADEMARK OFFICE
CERTIFICATE OF CORRECTION

PATENT NO. : 4,885,708

DATED : DECEMBER 5, 1989

INVENTOR(S) : TAKAHIRO YAMAGUCHI ET AL.

It is certified that error appears in the above-identified patent and that said Letters Patent is hereby corrected as shown below:

Col. 1, line 43, "L]" should be --[L]--.

Col. 3, line 65, "$\begin{bmatrix} G_{aa} & G_{ba} \\ G_{ab} & G_{bb} \end{bmatrix}$" should be -- $\begin{bmatrix} G_{aa} & G_{bc} \\ G_{ab} & G_{bb} \end{bmatrix}$ --.

Col. 4, line 34, "of" (second occurrence) should be --at--.

Col. 6, line 39, "numer" should be --number--.

Signed and Sealed this

Twenty-sixth Day of February, 1991

Attest:

HARRY F. MANBECK, JR.

Attesting Officer

Commissioner of Patents and Trademarks